United States Patent [19]

Thomas

[11] 4,196,309

[45] Apr. 1, 1980

[54] SEMICONDUCTOR DEVICE SUBASSEMBLY AND MANUFACTURE THEREOF

[76] Inventor: Robert G. Thomas, c/o R. G. Thomas Corporation, 61 Grand Ave., Palisades Park, N.J. 07650

[21] Appl. No.: 873,503

[22] Filed: Jan. 30, 1978

[51] Int. Cl.² .............................................. H01R 3/00
[52] U.S. Cl. ................................ 174/94 R; 403/179; 403/272; 357/67
[58] Field of Search ............... 174/94 R; 403/29, 179, 403/272; 357/67, 68, 71

[56] References Cited

U.S. PATENT DOCUMENTS

| 2,279,831 | 4/1942 | Lempert et al. ................. 403/179 X |
| 3,294,895 | 12/1966 | Reintgen et al. ................. 174/94 R |

Primary Examiner—Roy N. Envall, Jr.

[57] ABSTRACT

A semiconductor device subassembly of an elongated conductive lead member, a refractory metal slug and a brazing disk is constructed by mechanically securing the slug to the lead member, assembling the brazing disc to contact both the slug and the lead member and thereafter brazing the slug and the lead member together.

10 Claims, 3 Drawing Figures

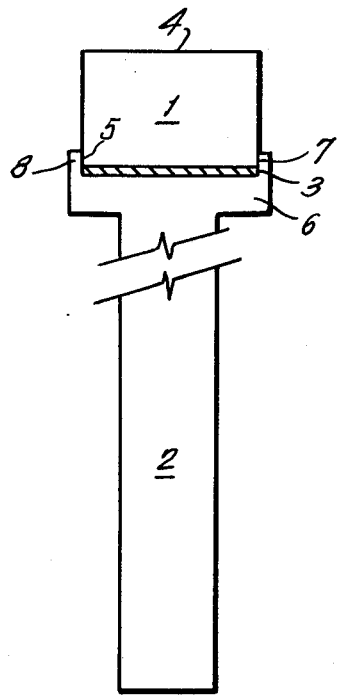
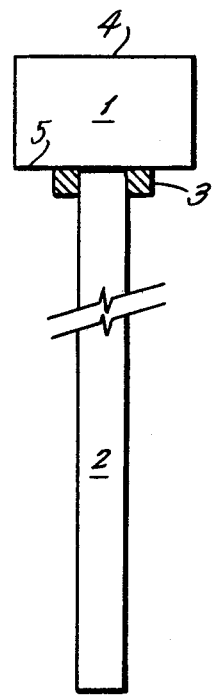
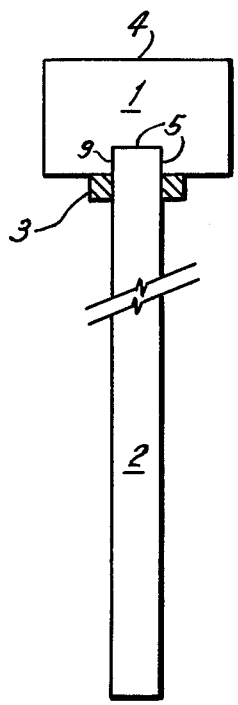

SEMICONDUCTOR DEVICE SUBASSEMBLY AND MANUFACTURE THEREOF

BACKGROUND OF THE INVENTION

Passivated semiconductor devices generally include a semiconductor body substantially composed of silicon, a passivating layer of such material as plastic or glass surrounding the semiconductor body, and at least one metallic contact extending outwardly from the semiconductor body through the passivating layer for connection to associated circuitry externally. The metallic contacts must be refractory in order that the coefficients of thermal expansion of the semiconductor layer, passivating layer and contact be reasonably matched to avoid breakage. The refractory metals are expensive and relatively poor conductors of heat and electricity. Therefore, the refractory metal contacts are joined to conventional conductors and the connection between the refractory contact and the other circuitry are made through the conventional conductor.

In axial lead construction semiconductor rectifiers, the connection of the conventional axial lead to the refractory metal contact is accomplished by the following procedures. In a first procedure, the refractory metal is plated with a solderable metal before application of the passifying layer and the axial leads are attached to the refractory metal contacts using solid solder preforms. This method requires a high degree of precision to prevent the lead from detaching from the contact and, soft solder joints are subject to thermal fatigue. A second procedure involves butt welding the refractory metal contact to the lead but unless the weld joint is protected with a coating there can be a failure of the weld, or wire under high temperature and high humidity conditions.

A third procedure is described in U.S. Pat. No. 3,930,306 in which the lead and refractory metal contact are joined through a brazing preform. This method, however, involves complicated fixturing problems primarily because of the size of the component parts. The surfaces which are joined in this method are typically of the order of about 30 to 60 mils. Additionally, the devices require a high degree of concentricity since the clearance between the lead and contact assembly and the passifying layer is usually of the order of about 5 mils. Therefore, even minor eccentricity leads to high rejection rates.

Accordingly it is the object of this invention to provide a new semiconductor device subassembly which can be accurately fixtured and in which there is a strong joint between the refractory metal contact and the lead and a process by which the semiconductor device subassembly can be made.

This and other objects of the invention will become apparent to those skilled in the art from the following detailed description in which FIG. 1 is a cross-section of a first embodiment of the present invention, FIG. 2 is a cross-section of a second embodiment of the present invention and FIG. 3 is a cross-section of a third embodiment of the present invention.

SUMMARY OF THE INVENTION

This invention relates to a semiconductor device subassembly and the manner in which it is produced. More particularly the invention relates to a subassembly of an elongated lead member, a refractory metal contact or slug and a brazing disk for brazing the slug and lead member together and the process of producing the subassembly which involves the steps of mechanically securing the contact to the lead member, assembling the brazing disk to contact both the slug and the lead member, and thereafter brazing the slug and the lead member together.

DESCRIPTION OF THE INVENTION

The three Figures show the semiconductor device subassembly of this invention which has a metallic contact 1, usually referred to as a "slug", a lead member 2 and a brazing disk 3. The refractory metal of slug 1 is typically tungsten, molybdenum, tantalum, and alloys thereof, and is preferably molybdenum. Lead 2 is an elongated member of a thermally and electrically conductive material, usually relatively ductile, such as silver and copper and the alloys thereof, and is preferably copper. The brazing disk is provided as a preformed member of commercially available brazing alloys such as the 80/15/5 silver solder. Such alloys have about 80% copper, about 15% silver and about 5% phosphorous. High temperature brazing alloys sold under the trademarks Silvaloy 15 and Silfos can also be used.

A first surface 4 of slug 1 is adapted to receive a semiconductor wafer in the conventional fashion. A second surface 5 of slug 1 is provided for contact with lead 2.

In the embodiment shown in FIG. 1, an end 6 of elongated lead member 2 to be attached to slug 1 is enlarged and is provided with a recess or pocket 7. Brazing disk 3 is disposed within recess 7 and slug 1 is nested in recess 7 on top of disk 3. The sidewalls 8 of enlarged end 6 are crimped around slug 1 to mechanically hold slug 1 and lead 2 in appropriate position for subsequent brazing.

In FIG. 2, the end of lead 2 and surface 5 of slug 1 are placed in contact and are welded together. The welding operation can be performed in any convenient fashion. While the resulting weld can contribute to the final strength of the joint between slug 1 and lead 2, it need not be of great strength since the weld is being used for fixturing purposes only. The brazing disk 3 is provided in the form of a ring which surrounds lead 2 and contacts the end of lead 2 and surface 5 of slug 1.

The third embodiment shown in FIG. 3 combines features of the first two embodiments. In this case, a recess or pocket 9 is provided in surface 5 of slug 1 and the lead member 2 fits and nests within recess 9. The dimensions of recess 9 and the end of lead 2 are such that lead 2 is held by a pressfit within recess 9. The brazing disk 3 is provided in the form of a ring which fits around lead 2 and in contact with both lead 2 and slug 1.

It will be noted that in all three embodiments, portions of slug 1 and lead 2 are in direct surface-to-surface contact, and also brazing disk 3 is in surface-to-surface contact with both slug 1 and lead 2.

The process of this invention involves the steps of mechanically securing slug 1 to lead member 2 without brazing the two together and assembling brazing disk 3 to contact both slug 1 and the end of lead 2. In the embodiment of FIG. 1, the mechanical securing can be achieved by pressfitting slug 1 into lead 2 and/or by crimping end portion 8 of lead 2 against slug 1; in the embodiment of FIG. 2, the mechanical securing is achieved by welding the surfaces together; and in the FIG. 3 embodiment, the mechanical securing is effected by pressfitting lead 2 into the recess 9 of slug 1. In the FIG. 1 embodiment, the brazing disk must be placed in position before slug 1 and lead 2 are mechanically secured while in the embodiments of FIGS. 2 and 3, the assembly of disk 3 can be effected before, during or after the mechanical securing.

The brazing operation is carried out in the conventional manner by raising the temperature to a suitable brazing temperature which causes the brazing alloy disk to melt and to permanently join slug 1 to lead member 2 when the temperature is reduced. If desired, the brazing can be effected long after the assembly and securing have been completed.

It will be appreciated that the configuration of the subassembly and the process described above eliminates complicated fixturing problems and provides a high quality concentric assembly with a minimum number of separate pieces and process steps. Although three embodiments of the invention have been described above, it will be appreciated that various other changes and modifications are possible without departing from the spirit and scope of this invention. Thus, the various embodiments which have been disclosed herein were set forth for the purpose of illustration only and were not intended to limit the invention.

What is claimed is:

1. A semiconductor device axial lead subassembly comprising, in combination: an elongated thermally and electrically conductive metal lead member having first and second ends; a refractory metal slug for connection to said first end of said lead member; a brazing disk disposed in contact with respective surface portions of said slug and said first end of said lead member; first means independent of said brazing disk mechanically securing together in surface-to-surface contact opposing surface portions of said lead member and said slug; said brazing disk adapted to permanently secure together said slug and said lead member.

2. The semiconductor device subassembly of claim 1 wherein one of said first end of said lead member and said refractory metal slug has a recess and the other of said first end of said lead member and said refractory metal slug nests within said recess and said brazing disk permanently securing together said slug and said lead member.

3. The semiconductor device subassembly of claim 2 wherein said first end of said lead member is enlarged and has said recess and wherein said brazing disk is disposed within said recess.

4. The semiconductor device subassembly of claim 2 wherein said refractory metal slug has said recess and said brazing disk is in the form of a ring around said elongated lead member.

5. The semiconductor device subassembly of claim 1 wherein said first means comprises a weld and wherein said brazing disk is in the form of a ring surrounding said elongated lead member permanently securing together said slug and said lead member.

6. A process of assembling a semiconductor device axial lead subassembly which subassembly comprises an elongated thermally and electrically conductive lead member, a refractory metal slug which is to be attached at one surface thereof to one end of said lead member and which has a second surface facing away from said lead member for receiving a semiconductor wafer, and a brazing disk for brazing said refractory metal slug to said lead member, said process comprising the steps of mechanically securing said refractory metal slug to said one end of said lead member without brazing the two together, and assembling said brazing disk to contact both said slug and said one end of said lead member.

7. The process of claim 6 wherein one of said slug and said one end of said lead member has a recess and the other of said slug and said one end of said lead member is nested within said recess and mechanically secured therein, and wherein said slug and said one end of said lead member are brazed together by raising the temperature to a brazing temperature to cause said brazing disk to melt and permanently join said slug to said one end of said lead member.

8. The process of claim 7 wherein said one end of said lead member has said recess and said one end is enlarged and wherein said brazing disk is positioned within said recess and in contact with both said slug and said one end of said lead member.

9. The process of claim 7 wherein said slug has said recess and said brazing disk is assembled by positioning a brazing ring around said one end of said lead member in contact with both said one end and said slug.

10. The process of claim 6 wherein said mechanically securing is effected by welding, and wherein said assembling said brazing disk is effected by positioning a brazing ring around said one end of said lead member and in contact with both said slug and said one end of said lead member, and wherein said slug and said one end of said lead member are brazed together by raising the temperature to a brazing temperature to cause said brazing disk to melt and permanently join said slug to said one end of said lead member.

* * * * *

UNITED STATES PATENT AND TRADEMARK OFFICE
CERTIFICATE OF CORRECTION

PATENT NO. : 4,196,309
DATED : April 1, 1980
INVENTOR(S) : Robert G. Thomas

It is certified that error appears in the above-identified patent and that said Letters Patent are hereby corrected as shown below:

Assigned to R. G. Thomas Corporation, a corporation of New Jersey.

Signed and Sealed this

Twenty-second Day of July 1980

[SEAL]

Attest:

SIDNEY A. DIAMOND

Attesting Officer

Commissioner of Patents and Trademarks